US 9,373,496 B2

(12) United States Patent
Choi et al.

(10) Patent No.: US 9,373,496 B2
(45) Date of Patent: *Jun. 21, 2016

(54) SUBSTRATE RECYCLING METHOD AND RECYCLED SUBSTRATE (71) Applicant: SEOUL VIOSYS CO., LTD., Ansan-si (KR)

(72) Inventors: Joo Won Choi, Ansan-si (KR); Chang Yeon Kim, Ansan-si (KR); Jeong Hoon Heo, Ansan-si (KR); Young Wug Kim, Ansan-si (KR); Su Yeon Hong, Ansan-si (KR); Sang Wan Ryu, Gwangju (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/085,876

(22) Filed: Nov. 21, 2013

(65) Prior Publication Data

US 2014/0138702 A1 May 22, 2014

(30) Foreign Application Priority Data

Nov. 21, 2012 (KR) .................. 10-2012-0132379
Dec. 13, 2012 (KR) .................. 10-2012-0145041

(51) Int. Cl.
*H01L 21/302* (2006.01)
*H01L 21/02* (2006.01)
*H01L 29/20* (2006.01)
*H01L 33/00* (2010.01)

(52) U.S. Cl.
CPC .... *H01L 21/02032* (2013.01); *H01L 21/02013* (2013.01); *H01L 21/02019* (2013.01); *H01L 29/2003* (2013.01); *H01L 33/0079* (2013.01); *H01L 33/007* (2013.01)

(58) Field of Classification Search
CPC .................... H01L 21/02032; H01L 21/02019
USPC ........................................................ 438/689
See application file for complete search history.

(56) References Cited

U.S. PATENT DOCUMENTS

| 9,048,086 | B2 * | 6/2015 | Hong et al. |
| 2010/0055818 | A1 | 3/2010 | Chen et al. |
| 2010/0317132 | A1 | 12/2010 | Rogers et al. |
| 2011/0053303 | A1 | 3/2011 | Kim et al. |
| 2012/0077334 | A1 | 3/2012 | Wuu et al. |
| 2013/0119401 | A1 | 5/2013 | D'Evelyn et al. |

OTHER PUBLICATIONS

Notice of Allowance issued on Jan. 28, 2015, in U.S. Appl. No. 14/264,924.
European Search Reported dated Mar. 3, 2016, in European Application No. 13193574.4.

* cited by examiner

*Primary Examiner* — Bradley K Smith
(74) *Attorney, Agent, or Firm* — H.C. Park & Associates, PLC (57) ABSTRACT Exemplary embodiments of the present invention provide a substrate recycling method and a recycled substrate. The method includes separating a substrate having a first surface from an epitaxial layer, performing a first etching of the first surface using electrochemical etching, and performing, after the first etching, a second etching of the first surface using chemical etching, dry etching, or performing, after the first etching, chemical mechanical polishing of the first surface.

24 Claims, 8 Drawing Sheets

SUBSTRATE RECYCLING METHOD AND RECYCLED SUBSTRATE

CROSS-REFERENCE TO RELATED APPLICATIONS

This application claims priority from and the benefit of Korean Patent Application Nos. 10-2012-0132379, filed on Nov. 21, 2012, and 10-2012-0145041, filed on Dec. 13, 2012, which are hereby incorporated by reference for all purposes as if fully set forth herein.

BACKGROUND

1. Field

Exemplary embodiments of the present invention relate to a substrate recycling method and a recycled substrate, and more particularly, to a method of recycling a growth substrate separated from an epitaxial layer, and a recycled growth substrate.

2. Discussion of the Background

After an epitaxial layer is grown on a substrate, the substrate may be separated from the epitaxial layer. For example, a vertical gallium nitride-based light emitting diode may be prepared by growing an epitaxial layer including n-type and p-type semiconductor layers on a growth substrate, followed by separating the growth substrate from the semiconductor layers. Luminous efficacy of the light emitting diode may be improved by attaching a support substrate having higher thermal conductivity than the growth substrate.

A light emitting diode may be manufactured by a technique, in which a growth substrate is used for growth of epitaxial layers, a support substrate distinguished from the growth substrate is attached to the epitaxial layers in consideration of operating characteristics of the light emitting diode, and the growth substrate is separated from the epitaxial layers. The growth substrate may be separated from the epitaxial layers by, for example, laser lift-off, chemical lift-off, thermal or mechanical lift-off, and the like.

The separated growth substrate may be reused as a substrate for growth of another epitaxial layer, thereby reducing manufacturing cost.

In order to reuse the substrate separated from the epitaxial layer, the separated substrate may be subjected to surface planarization. Chemical-mechanical polishing may be used for surface planarization. However, since a substrate used for growth of a gallium nitride-based semiconductor layer or the gallium nitride-based semiconductor layer grown thereon may have a high hardness, it may be difficult to achieve a desired level of surface planarization through chemical-mechanical polishing. As a result, the surface of the substrate subjected to chemical-mechanical polishing may include scratches, causing cracking.

Moreover, when a gallium nitride-based semiconductor layer remains on an initial substrate used as a growth substrate, the remaining gallium nitride-based semiconductor layer may break upon chemical-mechanical polishing. Thus, it may be difficult to determine suitable process conditions.

The gallium nitride-based semiconductor layer remaining on the substrate may be completely removed through decomposition by heating to a high temperature. However, this process may increase manufacturing costs due to heating of the grown gallium nitride-based semiconductor layer to high temperature. Moreover, when an initial substrate is a gallium nitride substrate, the initial substrate may be damaged. Therefore, it may be difficult to apply the technique of high temperature decomposition in practice.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide an improved substrate recycling method capable of recycling a substrate and a recycled substrate fabricated by the same.

Exemplary embodiments of the present invention also provide a substrate recycling method, where a gallium nitride-based semiconductor layer grown on an initial growth substrate can be reused, and a recycled substrate fabricated by the same method.

Additional features of the invention will be set forth in the description which follows, and in part will be apparent from the description, or may be learned by practice of the invention.

An exemplary embodiment of the present invention provides a substrate recycling method, the method including separating a substrate having a first surface from an epitaxial layer, performing a first etching of the first surface using electrochemical etching, and performing, after the first etching, a second etching of the first surface using chemical etching or dry etching, or performing, after the first etching, chemical mechanical polishing of the first surface.

An exemplary embodiment of the present invention also provides a substrate recycling method, the method including separating a substrate including a surface layer from an epitaxial layer, modifying the surface layer by forming pores within the surface layer, and removing the modified surface layer from the substrate.

An exemplary embodiment of the present invention also provides a recycled substrate including a first substrate, and an undoped gallium nitride-based semiconductor layer disposed on the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Exemplary embodiments of the present invention will be described in more detail with reference to the accompanying drawings. It should be understood that the following exemplary embodiments are given by way of illustration only to provide thorough understanding of the invention to those skilled in the art. Therefore, the present invention is not limited to the following exemplary embodiments and may be embodied in different ways. Further, like components will be denoted by like reference numerals throughout the specification, and the widths, lengths, and thicknesses of certain elements, layers or features may be exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments of the present invention include the provision of a separated substrate by separating a growth substrate from epitaxial layers after growing nitride semiconductor layers (epitaxial layers) on the growth substrate. The epitaxial layers separated from the growth substrate may be used to fabricate a semiconductor device such as a light emitting diode. Herein, a technique of fabricating a light emitting diode by separating a growth substrate will be described first, and a method of recycling the separated substrate will then be described.

Method of Fabricating Light Emitting Diode

Figure 1:
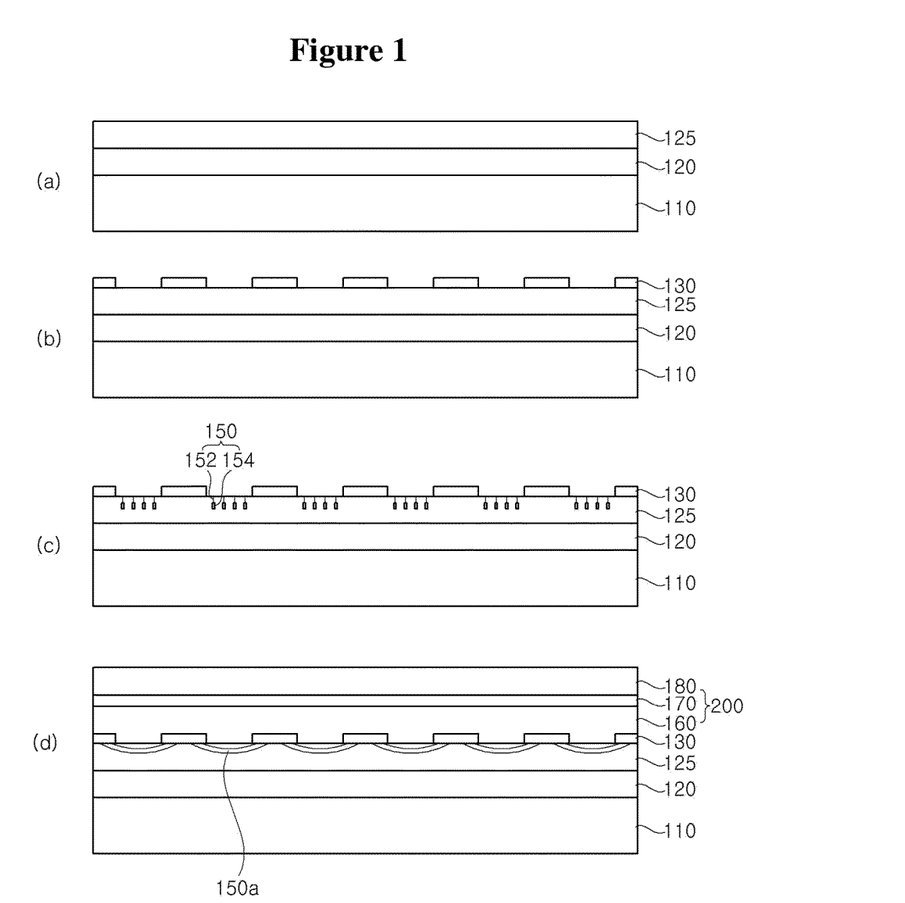
FIG. 1, FIG. 2, and FIG. 3 are sectional views illustrating a method of fabricating a light emitting diode using a process for separating a growth substrate in accordance with an exemplary embodiment of the present invention.
Figure 2:
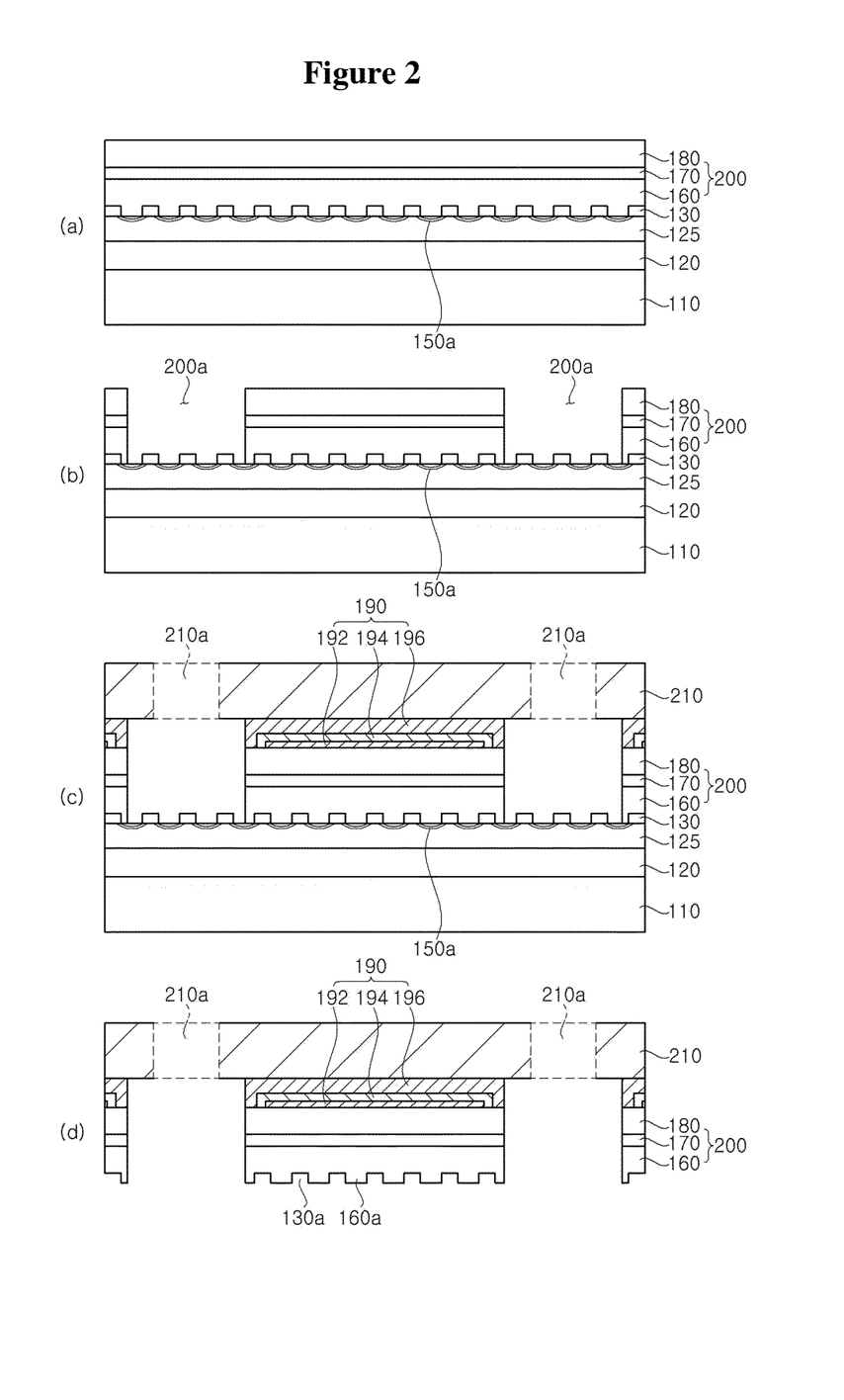
Figure 3:
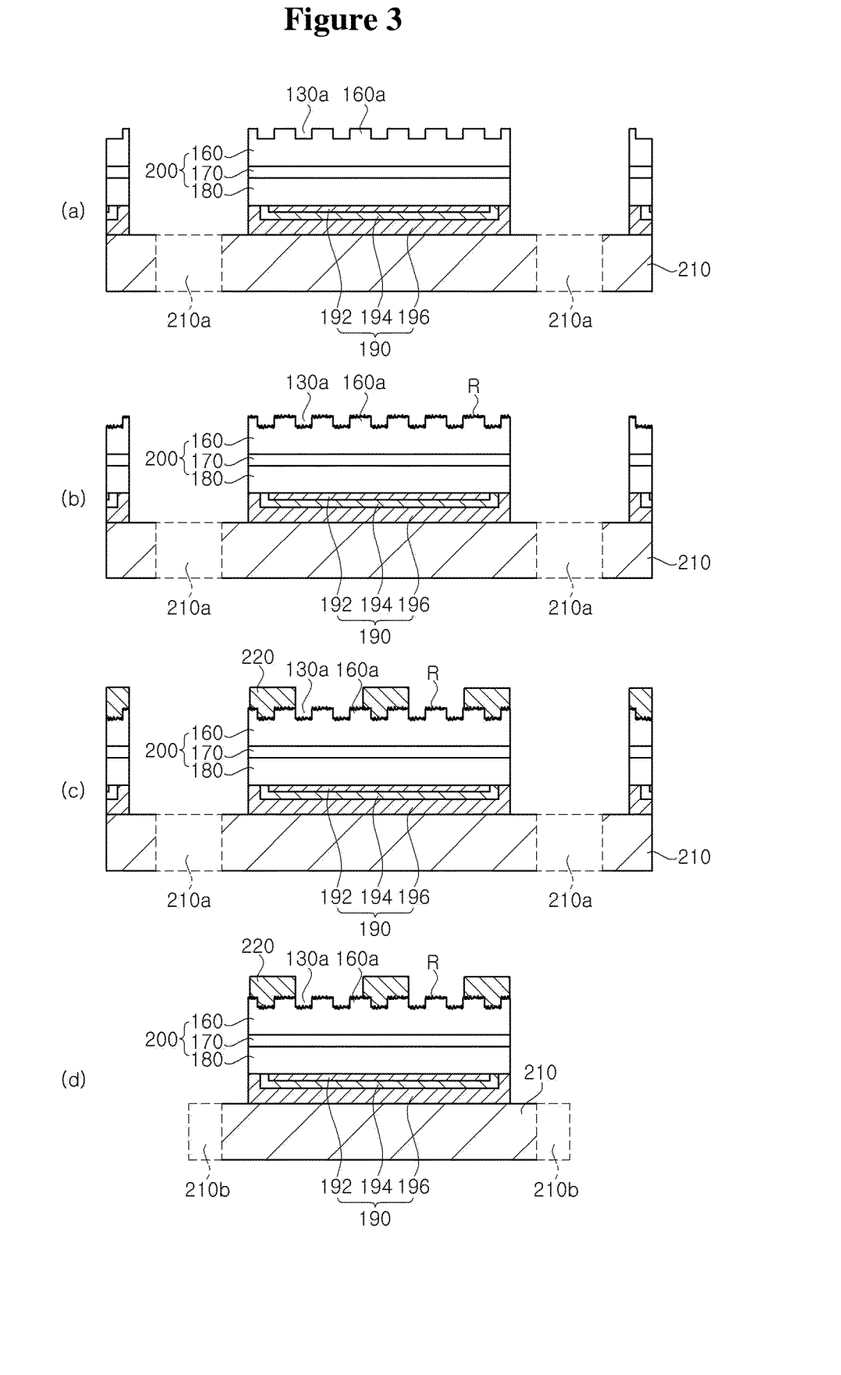

FIG. 1, FIG. 2, and FIG. 3 are sectional views illustrating a method of fabricating a light emitting diode in accordance with an exemplary embodiment of the present invention.

First, referring to FIG. 1(a), a growth substrate 110 is prepared. The growth substrate 110 may be a sapphire substrate, GaN substrate, silicon carbide (SiC) substrate, silicon (Si) substrate, or the like. Particularly, the growth substrate 110 may be a sapphire substrate or a GaN substrate, and may include a polar, non-polar, or semi-polar substrate.

An etching stop layer 120 and a sacrificial layer 125 are formed on the growth substrate 110. The etching stop layer 120 may include an undoped gallium nitride-based semiconductor layer, for example, undoped GaN, and the sacrificial layer 125 may include an n-type gallium nitride-based semiconductor layer. The undoped gallium nitride-based semiconductor layer 120 and the n-type gallium nitride-based semiconductor layer 125 may be grown on the growth substrate 110 by, for example, metal organic chemical vapor deposition (MOCVD) or molecular beam epitaxy (MBE). The undoped gallium nitride-based semiconductor layer 120 is grown without intentional impurity doping, and the n-type gallium nitride-based semiconductor layer 125 may be a gallium nitride-based layer, for example, a GaN layer, doped with a relatively high density of impurities, for example, in the range of 1E17 to 1E19 Si atoms/cm$^3$. As in the undoped gallium nitride-based semiconductor layer 120 and the n-type gallium nitride-based semiconductor layer 125, the following nitride-based semiconductor layers may also be grown by MOCVD or MBE, and a repeated description thereof will be omitted.

Figure 4:
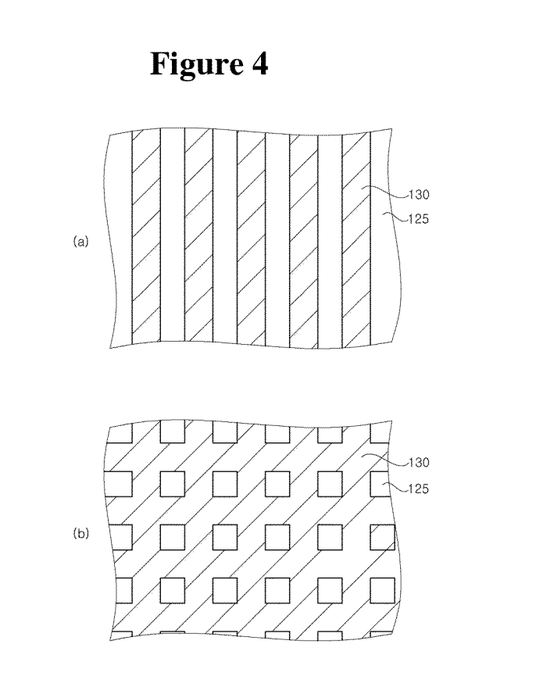
FIG. 4, FIG. 5, and FIG. 6 are plan views illustrating mask patterns for separation of a growth substrate.
Figure 5:
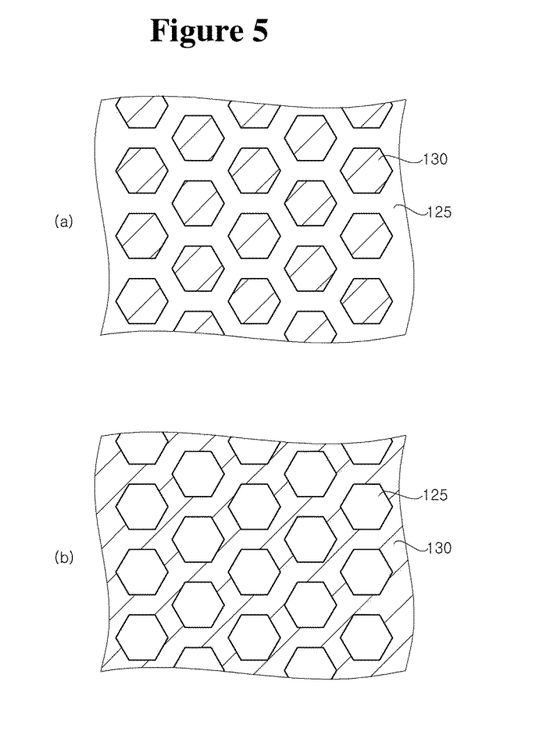
Figure 6:
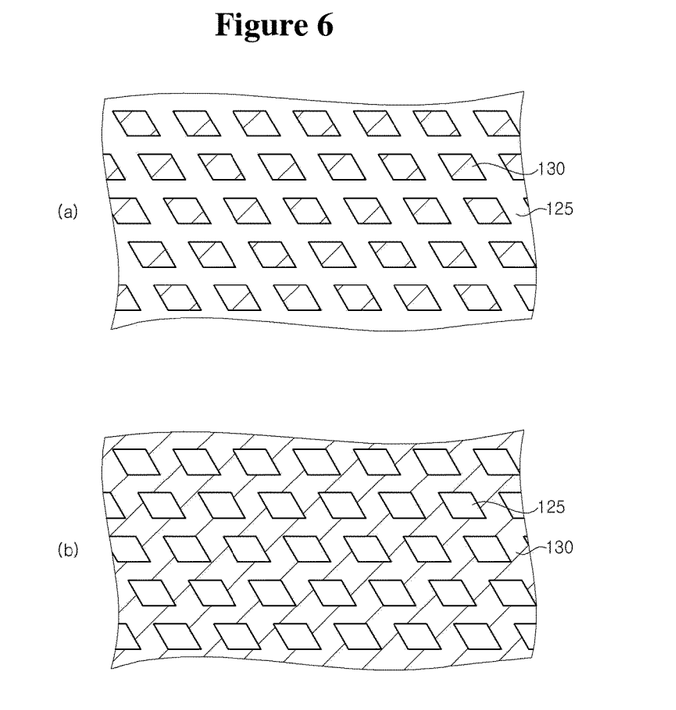

Referring to FIG. 1(b), a mask pattern 130 is formed on the sacrificial layer 125. The mask pattern 130 may be formed of, for example, silicon nitride or silicon dioxide to a thickness ranging from about 5 nm to about 10 μm. As show in FIG. 4(a), the mask pattern 130 may have a stripe shape in each mask region. Alternatively, as shown in FIG. 4(b), the mask pattern 130 may have stripe shapes extending in different directions to intersect each other (which may be referred to as a mesh pattern). Alternatively, the mask pattern 130 may have a convex pattern, in which mask regions have a hexagonal shape as shown in FIG. 5(a), or a rhombus shape as shown in FIG. 6(a). Alternatively, the mask pattern 130 may be a concave pattern, in which open regions have a hexagonal shape as shown in FIG. 5(b), or a rhombus shape as shown in FIG. 6(b). Here, FIGS. 4-6 merely show examples of the mask pattern 130. Thus, the mask pattern 130 may have various shapes. For example, the mask pattern 130 may be a convex pattern in which the mask regions have a circular shape, or a concave pattern in which the open regions have a circular shape. The mask pattern 130 may have a regular pattern size ranging from about 5 nm to about 20 μm.

Referring to FIG. 1(c), fine pores 150 are formed in the sacrificial layer 125 by partially etching the sacrificial layer 125 via electrochemical etching (ECE).

For electrochemical etching, the growth substrate 110 having the sacrificial layer 125 thereon is dipped together with a negative electrode (for example, a Pt electrode) into an ECE solution. Then, a positive voltage is applied to the sacrificial layer 125 and a negative voltage is applied to the negative electrode. The size of the fine pores 150 may be adjusted by adjusting the molarity of the ECE solution, process time, and applied voltage.

The ECE solution may be an electrolyte solution, for example, an electrolyte solution containing oxalic acid, HF or NaOH.

In the present exemplary embodiment, the sacrificial layer 125 may be partially removed by a single stage of electrochemical etching (ECE), in which a constant voltage, for example, a voltage ranging from 10V to 60V, is continuously applied. However, the present invention is not limited thereto. For example, the sacrificial layer 125 may be partially removed by two-stage electrochemical etching (ECE), in which a relatively low voltage is initially applied and a relatively high voltage is then applied. FIG. 1(c) shows fine pores 152, 154 formed by two-stage electrochemical etching, wherein the fine pores 152 having a relatively small size are formed in the first stage, in which a relatively low voltage is applied, and the fine pores 154 having a relatively large size are formed in the second stage, in which a relatively high voltage is applied. For example, electrochemical etching is performed using a 0.3M oxalic acid solution at 20° C. by applying a voltage of 8 V to 9 V in the first stage and a voltage of 15V to 17 V in the second stage to the n-type gallium nitride-based semiconductor layer 125 having a Si doping density of $6E18/cm^3$.

With two-stage electrochemical etching, the surface of the n-type gallium nitride-based semiconductor layer 125 can maintain relatively good crystallinity, and relatively large fine pores 154 can be formed in the n-type gallium nitride-based semiconductor layer 125, thereby providing favorable conditions for subsequent processes.

Referring to FIG. 1(d), a nitride semiconductor stack structure 200 including a first nitride semiconductor layer 160, an active layer 170 and a second nitride semiconductor layer 180 is grown on the n-type gallium nitride-based semiconductor layer 125 used as a seed layer. The nitride semiconductor stack structure 200 covers not only the sacrificial layer 125, but also the mask pattern 130 through lateral growth.

The first nitride semiconductor layer 160 may include a single layer or multiple layers. Such multiple layers may include an undoped layer and a doped layer.

During growth of the semiconductor stack structure 200, the fine pores 152, 154 are combined and grown to form cavities 150a. The cavities 150a are formed to connect adjacent mask regions in the mask pattern 130. In FIG. 1(d), an interface between the sacrificial layer 125 and the first nitride semiconductor layer 160 is illustrated as remaining. However, the cavities 150a may replace an interface between the sacrificial layer 125 and the first nitride semiconductor layer 160.

Referring to FIG. 2(a), a nitride semiconductor stack structure 200 including a first nitride semiconductor layer 160, an active layer 170, and a second nitride semiconductor layer 180 formed on the sacrificial layer 125 is shown. As described above, during growth of the semiconductor stack structure 200, the cavities 150a are formed in the n-type gallium nitride-based semiconductor layer 125 due to fine pores 152, 154 in the sacrificial layer 125. Here, FIG. 2(a) shows the same process stage as the process stage shown FIG. 1(d) at a different scale.

The first nitride semiconductor layer 160 may be a nitride semiconductor layer doped with a first conductivity-type impurity, for example, a III-N based compound semiconductor layer doped with an n-type impurity, such as an (Al, In, Ga)N-based nitride semiconductor layer, and may include a gallium nitride layer. In addition, the first nitride semiconductor layer 160 may include an undoped layer.

The active layer 170 may be a III-N based compound semiconductor layer, for example, an (Al, Ga, In)N semiconductor layer, and may have a single quantum-well structure or a multi-quantum well structure in which well layers (not shown) and barrier layers (not shown) are alternately stacked one above another.

The second nitride semiconductor layer 180 may be a III-N based compound semiconductor layer doped with a second conductivity-type impurity, for example, a P-type impurity, such as an (Al, Ga, In)N-based group-III nitride semiconductor layer, and may include, for example, a GaN layer.

Referring to FIG. 2(b), the nitride semiconductor stack structure 200 is subjected to patterning to form device isolation regions 200a. The device isolation regions 200a may be formed by photolithography and etching. The nitride semiconductor stack structure 200 may be divided into individual device regions, that is, a plurality of semiconductor stack structures 200, by the device isolation regions 200a.

As shown, the device isolation regions 200a allow the sacrificial layer 125 and the mask pattern 130 to be exposed therethrough.

Referring to FIG. 2(c), a support substrate 210 is attached to the nitride semiconductor stack structures 200. The support substrate 210 may be bonded to the nitride semiconductor stack structures 200 through metal layers 190. The metal layers 190 may include, for example, a reflective metal layer 192, a barrier metal layer 194, and a bonding metal layer 196. The barrier metal layer 194 covers the reflective metal layer 192, and the bonding metal layer 196 surrounds the reflective metal layer 192 and the barrier metal layer 194 to protect these layers from the etching solution. The reflective metal layer 192 is electrically connected to the second nitride semiconductor layer 180.

In the present exemplary embodiment, the metal layers 190 are illustrated as being formed after formation of the device isolation regions 200a. The reflective metal layer 192 and the barrier metal layer 194 may also be formed before formation of the device isolation regions 200a. In addition, the bonding metal layer 196 may also be formed before formation of the device isolation regions 200a.

The support substrate 210 may include through-holes 210a, as shown in the figures. These through-holes 210a may be aligned to be disposed inside the device isolation region 200a. The through-holes 210a may also be respectively disposed near four corners of the nitride semiconductor stack structure 200 within a single device region. The through-holes 210a help the etching solution to penetrate the device isolation regions 200a during chemical etching for chemical lift-off (CLO), thereby reducing time for separation of the growth substrate 110 from the nitride semiconductor stack structure 200. The through-holes 210a may be formed before or after disposing the support substrate 210 on the nitride semiconductor stack structures 200.

Referring again to FIG. 2(c), the support substrate 210 may be a sapphire substrate, a GaN substrate, a glass substrate, a silicon carbide substrate or a silicon substrate, a conductive substrate composed of a metallic material, a circuit substrate such as a PCB and the like, or a ceramic substrate.

In addition, a bonding metal layer (not shown) may be included on the support substrate 210 side to correspond to the bonding metal layer 196, and in this case, may be bonded to the bonding metal layer 196 on the nitride semiconductor stack structure 200 side by eutectic bonding, whereby the support substrate 210 can be attached to the nitride semiconductor stack structure 200.

Referring to FIG. 2(d), after the support substrate 210 is attached to the semiconductor stack structure 200, the growth substrate 110 is separated from the semiconductor stack structure 200 by chemical etching using an etching solution such as NaOH, BOE, or HF. The etching solution etches the mask pattern 130, or etches GaN at the interface between the mask pattern 130 and the nitride semiconductor stack structures 200, thereby separating the growth substrate 110 from the nitride semiconductor stack structure 200. The etching stop layer 120 and the sacrificial layer 125 may remain on the separated growth substrate 110, as will be described below in more detail with reference to FIG. 7.

Because the mask pattern 130 is removed, a convex-concave structure including recessed regions 130a and protruding regions 160a is formed on the surface of the nitride semiconductor stack structure 200, particularly, on the surface of the first nitride semiconductor layer 160.

Although chemical etching is performed for separation of the growth substrate 110 in the present exemplary embodiment, the growth substrate 110 may be separated from the nitride semiconductor stack structure 200 using other methods. In another exemplary embodiment, the growth substrate 110 may be separated from the nitride semiconductor stack structure 200 by application of stress. For example, after the cavities 150a are formed, stress may be applied to the mask pattern 130 to separate the growth substrate 110 from the nitride semiconductor stack structures 200.

FIG. 3(a) is an upside-down version of FIG. 2(d). Referring to FIG. 3(a), after the growth substrate 110 is separated from the nitride semiconductor stack structures 200, the surface of the nitride semiconductor stack structures 200 may be washed with chloric acid or the like to remove Ga droplets therefrom. In addition, the nitride semiconductor stack structures 200 may be partially removed by dry etching in order to remove a high resistance nitride semiconductor layer remaining on the surface thereof.

Referring to FIG. 3(b), photo-electrochemical etching (PEC) may be performed to form rough surface areas (R) on the surface of the nitride semiconductor stack structures 200. The rough surface areas (R) may be formed on the bottom of the recessed regions 130a and on the surface of the protruding regions 160a. Together with the recessed regions 130a and the protruding regions 160a, the rough surface areas (R) improve extraction efficiency of light generated in the active layer 170.

Next, referring to FIG. 3(c), an electrode 220 is formed on the nitride semiconductor stack structure 200. The electrode 220 may include an electrode pad for wire connection, and an extension extending from the electrode pad. The electrode 220 is electrically connected to the first nitride semiconductor layer 160. When the support substrate 210 is a conductive type substrate, the support substrate 210 may be electrically connected to the second nitride semiconductor layer 180 to function as an electrode, or a separate electrode pad may be additionally formed under the support substrate 210. When the support substrate 210 is formed of an insulator, the metal layers 190 may extend beyond the nitride semiconductor stack structure 200 to form an electrode pad.

Before or after the formation of the electrode 220, an insulating layer (not shown) may be further formed to cover the nitride semiconductor stack structure 200.

Referring to FIG. 3(d), the support substrate 210 is divided into a plurality of regions for individual devices, thereby providing light emitting diodes. The support substrate 210 may be divided into the plural regions by scribing along the device isolation region.

According to the present exemplary embodiment, the growth substrate 110 can be separated from the nitride semiconductor stack structure 200 without damage to the nitride semiconductor stack structure 200. In addition, the growth substrate 110 can be easily separated by application of stress or through chemical etching, since the growth substrate 110 is separated using the cavities 150 formed between the growth substrate 110 and the semiconductor stack structure 200.

In addition, since the through-holes 210a are formed together with the device isolation regions, more rapid infiltration of the etching solution can be achieved, thereby further reducing process time. Further, the separated growth substrate 110 may be reused as a growth substrate.

According to the exemplary embodiment described above, the method of fabricating a light emitting diode includes separation of the growth substrate through chemical lift-off or stress lift-off. However, it should be understood that the present invention is not limited to these substrate separation methods, and other applicable substrate separation methods, for example, laser lift-off, may also be used.

Substrate Recycling Method

Next, a method of recycling a substrate separated by such a substrate separation method will be described.

Figure 7:
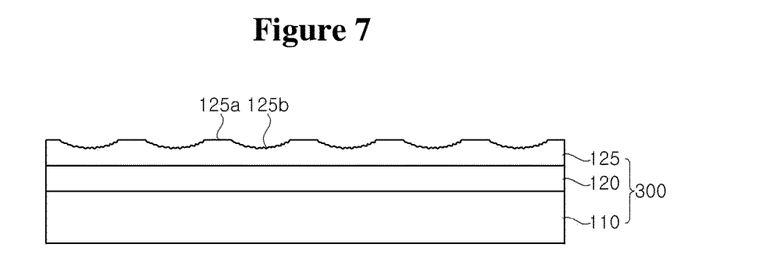
FIG. 7 is a sectional view of a substrate separated from an epitaxial layer.
Figure 8:
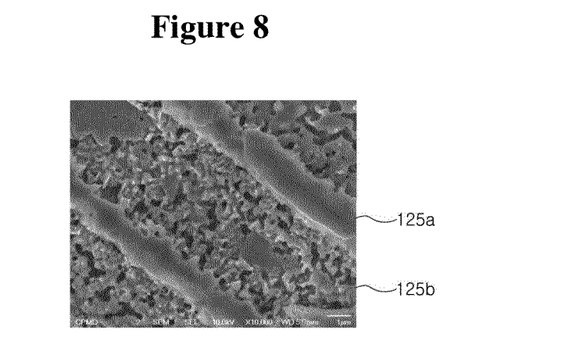
FIG. 8 is an SEM image of a surface of a substrate separated from an epitaxial layer according to an exemplary embodiment of the present invention.
Figure 9:
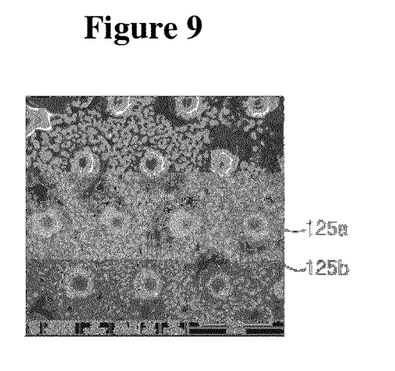
FIG. 9 is an SEM image of a surface of a substrate separated from an epitaxial layer according to an exemplary embodiment of the present invention.

FIG. 7 is a sectional view of a substrate 300 separated by the aforementioned technique, and FIG. 8 and FIG. 9 are SEM images of a surface of a substrate separated by chemical lift-off.

Referring to FIG. 7 and FIG. 8 or to FIG. 9, a separated substrate 300 may include an etching stop layer 120 and a sacrificial layer 125 (separated surface layer). Since the sacrificial layer 125 is disposed on a surface of the separated substrate 300, the sacrificial layer 125 may also be referred to as the surface layer 125 hereinafter. The surface of the separated substrate 300, for example, the surface layer 125, may include protrusions 125a and recesses 125b. The protrusions 125a have a flatter surface than the recesses 125b. As shown in FIG. 8 and FIG. 9, the recesses 125b have a very rough surface. Accordingly, the relatively flat surface protrudes above a relatively rough surface.

In the present exemplary embodiment, the protrusions 125a correspond to the mask regions of the mask pattern 130, and the recesses 125b correspond to the cavities 150a. Accordingly, the protrusions 125a or the flat surface areas may be arranged in a regular shape as in the mask pattern 130, for example, in a stripe shape of FIG. 8, in an island shape of FIG. 9, or in a mesh shape. The protrusions 125a and the recesses 125b are formed on the sacrificial layer 125 (surface layer). In addition, the etching stop layer 120 may be exposed through the recesses 125b.

As described above, the sacrificial layer 125 (surface layer) may include an n-type gallium nitride-based semiconductor layer, and the etching stop layer 120 may include an undoped gallium nitride-based semiconductor layer. Thus, the separated substrate 300 may include an n-type gallium nitride-based semiconductor layer 125 on a surface thereof, and the protrusions 125a and the recesses 125b may be formed on a surface of the n-type gallium nitride-based semiconductor layer 125.

As shown in FIG. 7, FIG. 8, and FIG. 9, the separated substrate 300 has a very rough surface, and may include the protrusions 125a and the recesses 125b. Such a rough surface can be formed not only by chemical lift-off, but also by stress lift-off (SOL) or laser lift-off (LLO). In order to reuse the substrate having such a rough surface as a growth substrate, the surface of the substrate should be planarized.

Next, a method of recycling a separated substrate according to an exemplary embodiment of the invention will be described in more detail.

Figure 10:
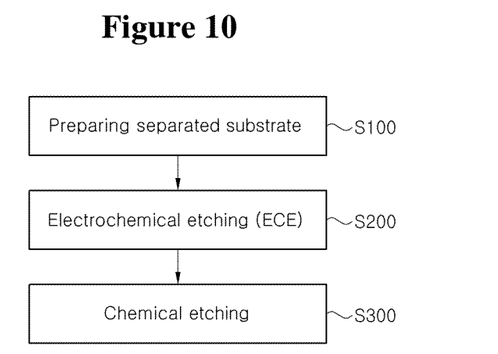
FIG. 10 is a schematic flowchart of a substrate recycling method in accordance with an exemplary embodiment of the present invention.
Figure 11:
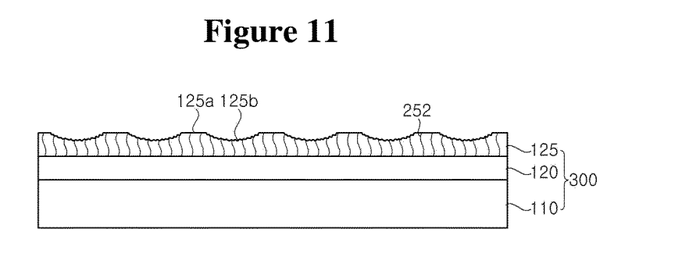
FIG. 11 is a sectional view illustrating a process of etching a surface of a substrate via electrochemical etching in accordance with an exemplary embodiment of the present invention.
Figure 12:
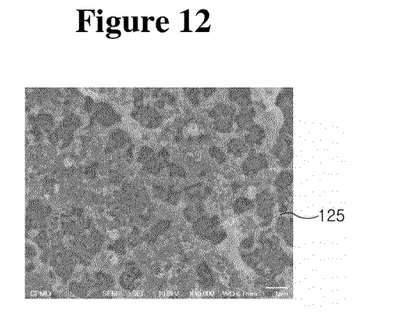
FIG. 12 is an SEM image of an etched surface of a substrate subjected to electrochemical etching.
Figure 13:
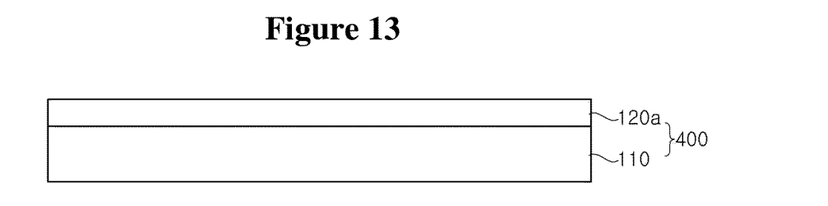
FIG. 13 is a sectional view illustrating a process of etching a surface of a substrate via chemical etching in accordance with an exemplary embodiment of the present invention.
Figure 14:
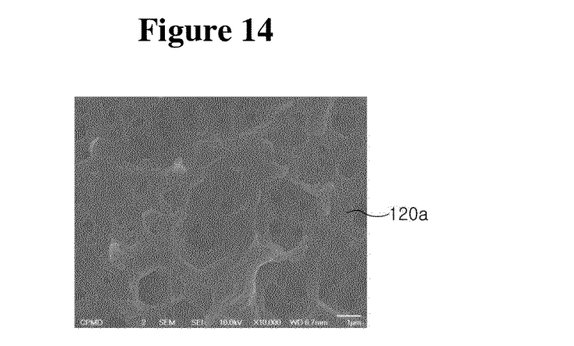
FIG. 14 is an SEM image of an etched surface of a substrate subjected to chemical etching.

FIG. 10 is a schematic flowchart of a substrate recycling method in accordance with an exemplary embodiment of the present invention, FIG. 11 and FIG. 13 are sectional views illustrating operations of the substrate recycling method in accordance with the exemplary embodiment, and FIG. 12 and FIG. 14 are SEM images of an etched surface of a substrate in respective operations of the substrate recycling method.

Referring to FIG. 10, a separated substrate 300 as described with reference to FIG. 7 is prepared (S 100). The separated substrate 300 includes a surface separated from an epitaxial layer, for example, a semiconductor stack structure 200. The separated substrate 300 includes an initial substrate 110, and may include a sacrificial layer 125 and an etching stop layer 120 disposed under the sacrificial layer 125, as described with reference to FIG. 7. The initial substrate 110 is a growth substrate for growth of a gallium nitride-based semiconductor layer. For example, the initial substrate 110 may be a sapphire substrate or a gallium nitride substrate, and may include a polar, non-polar, or semi-polar substrate.

Referring to FIGS. 10 and 11, the surface of the separated substrate 300 is subjected to electrochemical etching (ECE) (S200). By electrochemical etching (ECE), fine pores 252 may be formed in an upper region of the substrate 300, for example, in the sacrificial layer 125. The etching stop layer 120 prevents the fine pores 252 from being formed on the surface of the initial substrate 110.

In the present exemplary embodiment, the fine pores 252 are formed by electrochemical etching. However, it should be understood that the present invention is not limited to electrochemical etching. That is, the fine pores 252 may be formed by other techniques such as chemical etching, and the like.

For electrochemical etching (ECE), with the separated substrate 300 and a negative electrode (for example, a Pt electrode) dipped into an ECE solution, a positive voltage is applied to the sacrificial layer 125 and a negative voltage is applied to the negative electrode. Here, the size of the fine pores 150 may be changed by adjusting the molarity of the ECE solution, process time, and applied voltage. The ECE solution may be an electrolyte solution containing oxalic acid. For example, electrochemical etching may be performed using an oxalic acid solution by applying a voltage of 10 V to 100 V.

In FIG. 12, the SEM image shows an etched surface of the substrate after electrochemical etching of the n-type gallium nitride-based semiconductor layer 125 having a Si doping density of about $6E18/cm^3$ for 10 minutes by applying a voltage of 40 V to 0.3M oxalic acid solution at 20° C.

As can be seen from FIG. 12, electrochemical etching makes it difficult to distinguish the rough surface areas from the flat surface areas on the surface of the n-type gallium nitride-based semiconductor layer 125.

Referring to FIG. 10 and FIG. 13, the surface of the separated substrate 300 is subjected to chemical etching (S300). The portion of the substrate etched by electrochemical etching is removed from the substrate by chemical etching, thereby providing a recycled substrate 400. In this embodiment, the sacrificial layer 125 may be removed by chemical etching and the recycled substrate 400 on which an etching stop layer 120a remains may be provided. The etching stop layer 120a may be an etching stop layer 120, the surface of which is partially etched by chemical etching. Higher resistance of the etching stop layer 120 with respect to chemical etching provides more efficient prevention of surface etching.

Chemical etching may be performed in a solution containing, for example, NaOH or KOH. In addition, for more efficient etching, the solution may be heated to about 50° C. or more.

On the other hand, a side surface of the substrate 300 may be etched by chemical etching. Accordingly, to prevent the side surface of the substrate 300 from being etched, the side surface of the substrate 300 may be covered by an etching stop layer (not shown). Any material may be used for the etching stop layer so long as the material is capable of preventing the side surface of the substrate 300 from being etched upon chemical etching. For example, the etching stop layer may be a tape or the like for process convenience.

FIG. 14 is an SEM image of a surface of a substrate after chemical etching in NaOH, $H_2O_2$, and deionized water. As can be seen from FIG. 14, when electrochemical etching and chemical etching are performed together, a recycled substrate 400 having a flat surface is fabricated.

Figure 15:
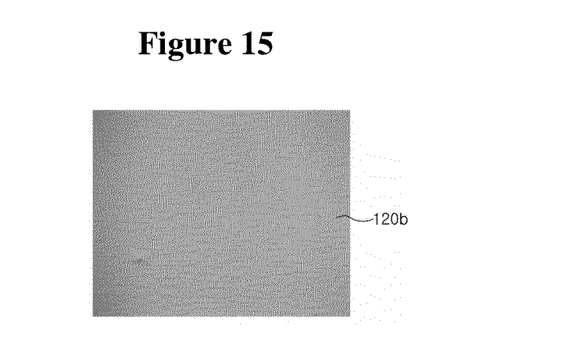
FIG. 15 is an optical micrograph of a surface of a gallium nitride layer grown on a recycled substrate.

In order to confirm whether the recycled substrate 400 prepared by the method according to the present exemplary embodiment may be used as a growth substrate, a gallium nitride layer was grown on the recycled substrate 400. FIG. 15 is an optical micrograph of a surface of a gallium nitride layer grown on a recycled substrate.

As can be seen from FIG. 15, the gallium nitride layer grown on the recycled substrate 400 has very good surface quality despite a hillock formed on the surface thereof. Thus, the recycled substrate 400 fabricated by the method according to the present invention may be reused as a growth substrate for growth of an epitaxial layer.

In addition, an undoped gallium nitride-based semiconductor layer is further grown on the recycled substrate 400 and a sacrificial layer 125 of an n-type gallium nitride-based semiconductor layer is grown again thereon, followed by the processes as described with reference to FIG. 1, FIG. 2, and FIG. 3, thereby providing light emitting diodes, wherein yield of the light emitting diodes fabricated on the recycled substrate 400 is about 90% or more that of light emitting diodes fabricated on the initial substrate 110.

In the substrate recycling method according to the present exemplary embodiment, electrochemical etching and chemical etching are used together, thereby providing a recycled substrate having a relatively flat surface. In addition, the substrate recycling method according to the present exemplary embodiment does not require complete removal of the gallium nitride-based semiconductor layer grown on the initial substrate 110, and removes only some of the gallium nitride-based semiconductor layer on the surface of the substrate. Thus, the substrate recycling method according to the present exemplary embodiment is more suitable for recycling of the substrate by enhancing material use efficiency as compared with typical techniques wherein grown semiconductor layers are completely removed from a target substrate.

The recycled substrate 400 prepared by the method according to the present exemplary embodiment may be reused as a growth substrate for growth of an epitaxial layer. In addition, a light emitting diode may be fabricated through the processes as described with reference to FIG. 1, FIG. 2, and FIG. 3, and detailed descriptions thereof will be omitted herein.

Although chemical etching is illustrated as being performed together with electrochemical etching in the method according to the present exemplary embodiment, dry etching or chemical mechanical polishing may be used instead of chemical etching.

Figure 16:
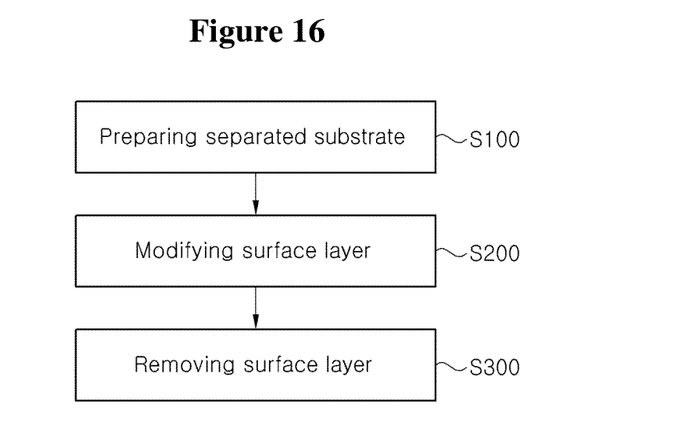
FIG. 16 is a schematic flowchart of a substrate recycling method in accordance with an exemplary embodiment of the present invention.
Figure 17:
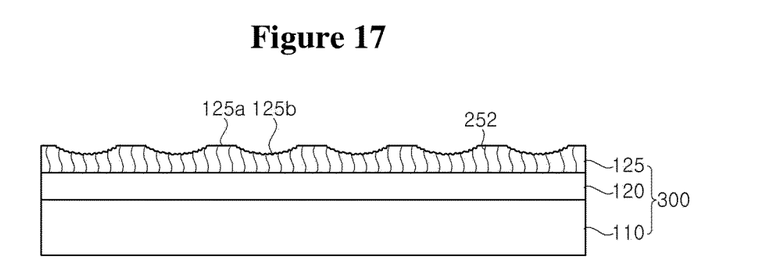
FIG. 17 is a sectional view illustrating a process of etching a surface of a substrate via electrochemical etching in accordance with an exemplary embodiment of the present invention.
Figure 18:
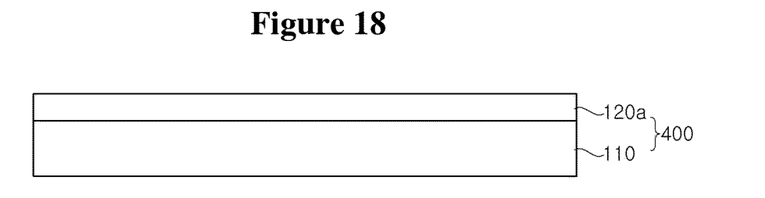
FIG. 18 is a schematic sectional view of a recycled substrate from which a surface layer is removed.

FIG. 16 is a schematic flowchart of a substrate recycling method in accordance with an exemplary embodiment of the present invention, and FIGS. 17 and 18 are sectional views illustrating operations of the substrate recycling method in accordance with the present exemplary embodiment.

Referring to FIG. 16, a separated substrate 300 as described with reference to FIG. 7 is prepared (S100). The separated substrate 300 includes a surface separated from an epitaxial layer, for example, a semiconductor stack structure 200. The separated substrate 300 includes an initial substrate 110, and may include a surface layer 125 and an etching stop layer 120 disposed under the surface layer 125, as described with reference to FIG. 7. The initial substrate 110 is a growth substrate for growth of a gallium nitride-based semiconductor layer. For example, the initial substrate 110 may be a sapphire substrate or a gallium nitride substrate, and may include a polar, non-polar, or semi-polar substrate.

Referring to FIG. 16 and FIG. 17, the surface layer 125 is modified to form fine pores 252 within the surface layer 125. The fine pores 252 may be formed by etching the surface layer 125 using, for example, electrochemical etching (ECE). The etching stop layer 120 prevents the fine pores 252 from being formed on the surface of the initial substrate 110 during modification of the surface layer 125.

For electrochemical etching (ECE), with the separated substrate 300 and a negative electrode (for example, a Pt electrode) dipped into an ECE solution, a positive voltage is applied to the surface layer 125 and a negative voltage is applied to the negative electrode. Here, the size of the fine pores 252 may be adjusted by adjusting the molarity of the ECE solution, process time, and applied voltage. The ECE solution may be an electrolyte solution containing oxalic acid. For example, electrochemical etching may be performed by applying a voltage of 10 V to 100 V in an oxalic acid solution. The ECE solution may be an electrolyte solution containing oxalic acid. For example, electrochemical etching may be performed for 1 minute to several hours by applying a voltage of 10 V to 100 V in 0.3M oxalic acid solution at 20° C. In addition, electrochemical etching may be performed while increasing or decreasing the voltage in at least two stages. When increasing the voltage in at least two stages, larger fine pores can be formed in the surface layer 125.

Electrochemical etching makes it difficult to distinguish the rough surface areas from the flat surface areas on the surface layer 125.

In the present exemplary embodiment, the fine pores 252 are formed by electrochemical etching. However, it should be understood that the present invention is not limited to electrochemical etching. That is, the fine pores 252 may be formed by other techniques such as chemical etching, and the like.

Referring to FIG. 16 and FIG. 18, the modified surface layer 125 is removed (S300). The surface layer 125 may be removed by chemical mechanical polishing or dry etching. By removing the modified surface layer 125 through chemical mechanical polishing or dry etching, a recycled substrate 400 is provided. In the present exemplary embodiment, the surface layer 125 is removed by chemical mechanical polishing or dry etching, whereby the recycled substrate 400 having the etching stop layer 120a remaining thereon can be provided. The etching stop layer 120a may be an etching stop layer 120, the surface of which is partially etched or removed. Chemical mechanical polishing or dry etching is stopped at the etching stop layer 120.

When the surface of the substrate is subjected to planarization by chemical mechanical polishing without modifying the surface layer 125, crystal defects such as cracks can be formed in the surface layer 125 or the etching stop layer 120. However, in the present exemplary embodiment, the surface layer 125 is modified in advance, thereby allowing the surface layer 125 to be removed by chemical mechanical polishing without generating defects to the etching stop layer 120.

In addition, after the surface layer 125 is removed by chemical mechanical polishing, the exposed etching stop layer 120 may be planarized by dry etching such as ICP-RIE.

When the surface layer 125 is directly etched by dry etching without modification of the surface layer 125, it may be difficult to achieve desired planarization since the surface layer 125 and the etching stop layer 120 are the same kind of gallium nitride material. However, in the present exemplary embodiment, since the surface layer 125 is modified in advance, etching selectivity of the surface layer 125 and the etching stop layer 120 can be adjusted, thereby providing a planar surface while removing the surface layer 125 through dry etching such as ICP-RIE.

Figure 19:
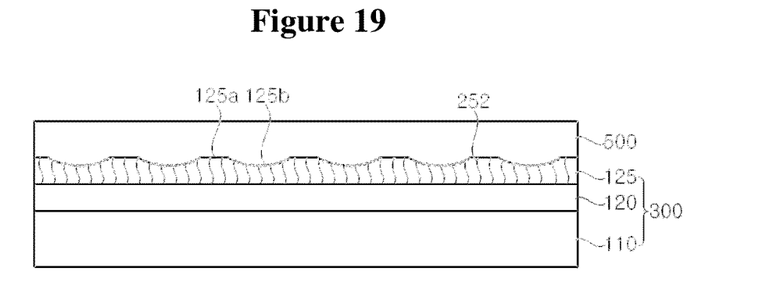
FIG. 19 is a schematic sectional view illustrating a substrate recycling method in accordance with an exemplary embodiment of the present invention.

FIG. 19 is a sectional view illustrating a substrate recycling method in accordance with an exemplary embodiment of the present invention.

Referring to FIG. 19, first, fine pores 252 are formed in a surface layer 125 through the same processes as described with reference to FIGS. 16 and 17. Then, a planarized layer 500 is formed to cover the modified surface layer 125. The planarized layer 500 may be formed by curing a photoresist or a fluid material such as SOG deposited on the modified surface layer 125. The planarized layer 500 covers protrusions 125a and recesses 125b on the surface layer 125, and provides a flatter surface than that of the surface of the surface layer 125.

Then, the surface layer 125 is removed together with the planarized layer 500 by dry etching such as ICP-RIE, thereby providing a recycled substrate 400 as shown in FIG. 18.

The planarized layer 500 is formed of a material having a similar etching rate to that of the surface layer 125, whereby the etching stop layer 120a can have a relatively flat surface.

In the substrate recycling method according to the present exemplary embodiment, the surface layer 125 exposed on the surface of the separated substrate 300 is modified in advance, whereby the recycled substrate can be provided by easily removing the surface layer 125. Furthermore, in the substrate recycling method according to the present exemplary embodiment, only some of the gallium nitride-based semiconductor layer on the surface thereof is removed, instead of completely removing the gallium nitride-based semiconductor layer grown on the initial substrate 110. Thus, the method according to the present exemplary embodiment is more suitable for recycling the substrate due to higher efficiency in terms of material use than typical substrate recycling methods in which grown semiconductor layers are completely removed from a substrate to be recycled.

The recycled substrate 400 fabricated by the method according to the present exemplary embodiment may be used as a growth substrate for growth of an epitaxial layer. In addition, light emitting diodes may be fabricated through the processes as described with reference to FIG. 1, FIG. 2, and FIG. 3, and detailed descriptions thereof will be omitted.

In the present exemplary embodiment, the modified surface layer 125 is removed by dry etching or chemical mechanical polishing. However, as described with reference to FIG. 10, it should be understood that the modified surface layer 125 may be removed by chemical etching.

Thus, exemplary embodiments of the present invention provide a recycled substrate having a relatively flat surface suitable for growth of an epitaxial layer such as a gallium nitride-based semiconductor layer. In addition, exemplary embodiments provide a recycled substrate having an undoped gallium nitride-based semiconductor layer disposed on an upper side thereof.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain exemplary embodiment may also be applied to other exemplary embodiments without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A substrate recycling method, the method comprising:
    separating a substrate comprising a first surface from an epitaxial layer;
    performing a first etching of the first surface using electrochemical etching; and
    performing, after the first etching, a second etching of the first surface using chemical etching or dry etching, or performing, after the first etching, chemical mechanical polishing of the first surface,
    wherein:
    the first surface comprises a sacrificial layer; and
    the substrate further comprises an etching stop layer disposed under the sacrificial layer.

2. The method of claim 1, wherein the sacrificial layer comprises an n-type gallium nitride-based semiconductor layer, and the etching stop layer comprises an undoped gallium nitride-based semiconductor layer.

3. The method of claim 2, wherein the sacrificial layer is removed and the etching stop layer is exposed by the chemical etching, dry etching, or chemical mechanical polishing.

4. The method of claim 1, wherein the first etching forms pores in the sacrificial layer.

5. The method of claim 1, wherein the first surface comprises a protrusion and a recess, the protrusion comprising a flatter surface than the recess.

6. The method of claim 5, wherein the protrusion comprises a stripe shape, an island shape, or a mesh shape.

7. The method of claim 1, further comprising forming an etching stop layer on a side surface of the substrate.

8. The method of claim 1, wherein the substrate comprises an initial substrate, the initial substrate comprising sapphire or gallium nitride.

9. The method of claim 1, wherein electrochemical etching is performed using an oxalic acid solution and an applied voltage in the range of 10 V to 100 V.

10. The method of claim 9, wherein the second etching is performed using chemical etching, the chemical etching being performed using a solution containing NaOH or KOH.

11. A substrate recycling method, the method comprising:
    separating a substrate comprising a surface layer from an epitaxial layer;
    modifying the surface layer by forming pores within the surface layer; and
    removing the modified surface layer from the substrate,
    wherein the separated surface layer comprises a protrusion and a recess, the protrusion comprising a flatter surface than the recess.

12. The method of claim 11, wherein the modified surface layer is removed by chemical etching, chemical mechanical polishing, or dry etching.

13. The method of claim 12, further comprising forming an etching stop layer under the surface layer.

14. The method of claim 13, wherein the surface layer comprises an n-type gallium nitride-based semiconductor layer, and the etching stop layer comprises an undoped gallium nitride-based semiconductor layer.

15. The method of claim 14, wherein the n-type gallium nitride-based semiconductor layer is removed and the undoped gallium nitride-based semiconductor layer is exposed by the chemical etching, chemical mechanical polishing, or dry etching.

16. The method of claim 11, wherein the pores are formed by electrochemical etching.

17. The method of claim 16, wherein the electrochemical etching is performed in two stages by changing an applied voltage.

18. The method of claim 15, wherein the n-type gallium nitride-based semiconductor layer is removed by chemical mechanical polishing, and the exposed undoped gallium nitride-based semiconductor layer is planarized by dry etching.

19. The method of claim 11, wherein the protrusion comprises a stripe shape, an island shape, or a mesh shape.

20. The method of claim 11, further comprising before removing the surface layer, forming a planarized layer on the surface layer.

21. The method of claim 20, wherein the surface layer is removed together with the planarized layer by dry etching.

22. The method of claim 11, wherein the substrate comprises an initial substrate, the initial substrate comprising sapphire substrate or gallium nitride.

23. The method of claim 11, wherein the pores are formed by electrochemical etching in an oxalic acid solution to which a voltage in the range of 10 V to 100 V is applied.

24. The method of claim 11, wherein the surface layer comprises flat areas and rough areas arranged in a regular pattern thereon.

* * * * *